(12) United States Patent  
Adams et al.

(10) Patent No.: US 6,624,647 B2
(45) Date of Patent: Sep. 23, 2003

(54) TEST SOCKET FOR BALL GRIB ARRAY ELECTRONIC MODULE

(75) Inventors: Christopher S. Adams, San Jose, CA (US); Scott B. Beardsley, Fremont, CA (US)

(73) Assignee: FCI USA, Inc., Etters, PA (US)

( * ) Notice: Subject to any disclaimer, the term of this patent is extended or adjusted under 35 U.S.C. 154(b) by 0 days.

(21) Appl. No.: 09/899,691

(22) Filed: Jul. 5, 2001

(65) Prior Publication Data

US 2003/0006792 A1 Jan. 9, 2003

(51) Int. Cl.[7] .............................................. G01R 31/02
(52) U.S. Cl. ........................................................ 324/755
(58) Field of Search ................................ 324/755, 761, 324/765, 757; 439/700, 261, 298, 544; 702/117, 118

(56) References Cited

U.S. PATENT DOCUMENTS

| | | | |
|---|---|---|---|
| 5,347,215 A | 9/1994 | Armstrong et al. | 324/158.1 |
| 5,481,203 A | 1/1996 | Appold | 324/755 |
| 5,482,471 A | 1/1996 | Mori et al. | 439/263 |
| 5,795,172 A | 8/1998 | Shahriari et al. | 439/260 |
| 5,807,104 A | 9/1998 | Ikeya et al. | 439/73 |
| 5,955,888 A | 9/1999 | Frederickson et al. | 324/761 |
| 5,966,020 A | 10/1999 | Rampone et al. | 324/755 |
| 6,333,858 B1 * | 12/2001 | Yun et al. | 361/807 |

* cited by examiner

Primary Examiner—Michael Nghiem
(74) Attorney, Agent, or Firm—Harrington & Smith LLP

(57) ABSTRACT

An electronic module test assembly including a frame, an array of contact pins, and at least one latch. The frame has a recess formed therein for receiving an electronic module. The array of contact pins is anchored to the frame. The contact pins have resiliently depressible terminals forming a resiliently depressible contact array in the recess. The latch is movably mounted to the frame for latching the electronic module to the frame. The latch is movable relative to the frame and engages an outer edge of the electronic module when the electronic module is disposed against the resiliently depressible contact array. The resiliently depressible contact array biases the electronic module against the latch.

32 Claims, 4 Drawing Sheets

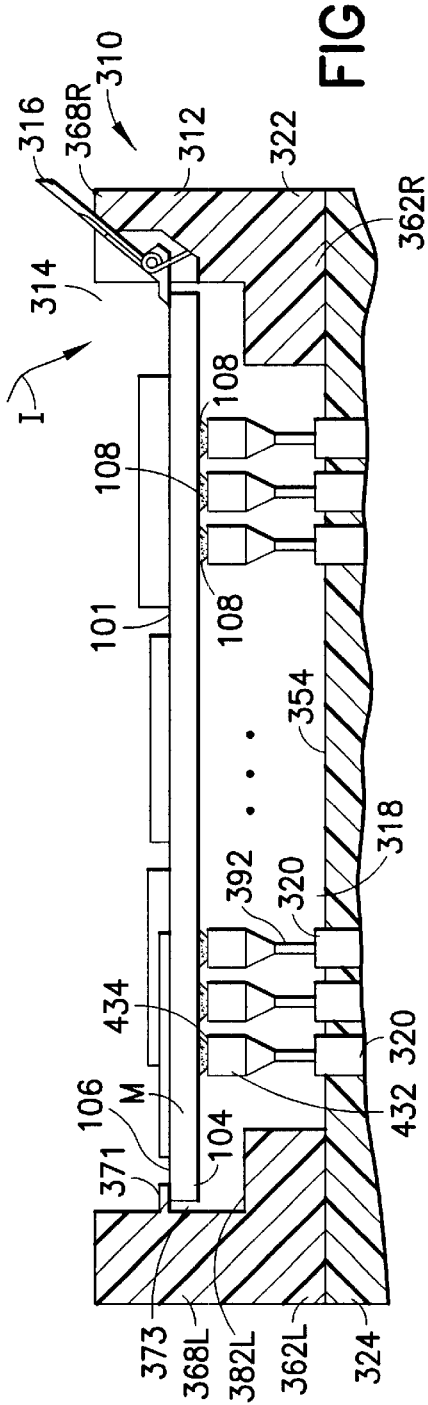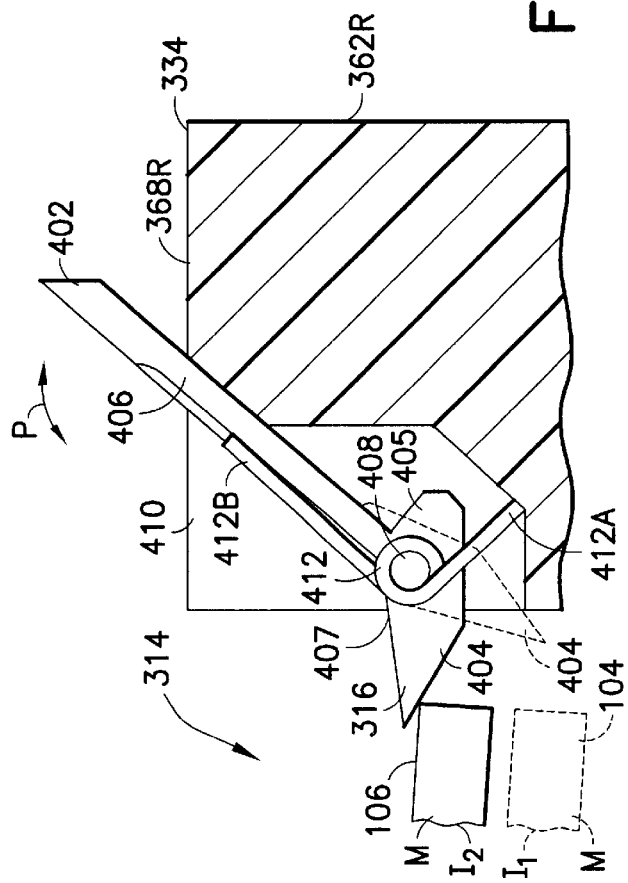

TEST SOCKET FOR BALL GRIB ARRAY ELECTRONIC MODULE

BACKGROUND OF THE INVENTION

1. Field of the Invention

The present invention relates to test sockets for electronic modules and, more particularly, to a test socket for a ball grid array electronic module.

2. Brief Description of Earlier Developments

The continued desire of consumers for ever smaller electronic device has spurred increased miniaturization of electronic components. In response, manufacturers have been driven to add more and more components into smaller integrated electronic packages or modules. One such module is the "Bluetooth" architecture, system-on-a-chip or "super component" module developed by Lucent Technologies and Ericsson. The "Bluetooth" super component module incorporates an entire RF/baseband radio subsystem into a single component. The electronic modules must be tested for purposes of quality assurance (QA) after manufacture, as well as for R&D purposes. QA testing is basic, checking the general operation of the manufactured module such as the existence of open connection or shorts in the module. One example of a conventional test socket for reliability or "burn-in" testing of IC chips is disclosed in U.S. Pat. No. 5,807,104. This test socket has a base with a positioning plate with contacts slidingly contained therein. An IC chip is placed on the positioning plate, and the socket has a hinged cover which is closed over the chip bringing the chip into contact with the contacts in the positioning plate. Another example of a conventional apparatus for testing ball grid array packaged integrated circuits is disclosed in U.S. Pat. 5,955,888. The apparatus here has a nesting member to hold the integrated circuit (IC). The nesting member is resiliently supported on a printed circuit board. A device handler is placed over the IC, and presses the IC and nesting member down to contact spring loaded pins in the printed circuit board. As can be realized from the above examples, conventional testing sockets have a substantially closed architecture which interferes with an operator's ability to access components mounted on the tested module. This arrangement is generally suitable for some general reliability testing but does not lend itself to specific fault investigation or R&D testing of the electronic modules. R&D testing is performed on the modules as part of design development and integration of a given module type within the system of a given electronic device. Accordingly, in order to perform R&D testing of a module, operators may have to access individual miniature components on the electronic module. Unimpeded access to the miniature components on electronic modules such as the "Bluetooth" super component modules is generally not available with conventional test sockets. The present invention overcomes the problems of the prior art as will be described in greater detail below.

SUMMARY OF THE INVENTION

In accordance with a first embodiment of the present invention, an electronic module test assembly is provided. The test assembly comprises a frame, an array of contact pins, and at least one latch. The frame has a recess formed therein for receiving an electronic module. The array of contact pins is anchored to the frame. The contact pins have resiliently depressible terminals forming a resiliently depressible contact array in the recess. The latch is movably mounted to the frame for latching the electronic module to the frame. The latch is movable relative to the frame and engages an outer edge of the electronic module when the electronic module is disposed against the resiliently depressible contact array. The resiliently depressible contact array biases the electronic module against the latch.

In accordance with a second embodiment of the present invention, an electronic module test socket is provided. The test socket comprises an insulating frame, at least one contact pin, and at least one latch. The insulating frame has an electronic module receiving recess formed therein. The contact pin is secured to the frame. The contact pin has a resiliently movable contact terminal disposed in the recess. The latch is connected to the frame. The latch is movable relative to the frame for locking an electronic module received in the recess to the frame. When the electronic module is received in the recess, the electronic module resiliently moves the contact terminal effecting contact between the module and contact terminal and allowing the latch to move and engage a top side of the module. This maintains the module in contact with the contact terminal and leaves an access area over the module substantially open for a user to access module components on the top side of the module.

In accordance with a method of the present invention, a method for testing an electronic module is provided. The method comprises the steps of providing a test socket, and inserting an electronic module in the test socket. The test socket is provided with an electronic module receiving recess therein, and an array of spring loaded contact pins having resiliently depressible contact terminals projecting into the recess. The test socket is provided with a movable latch for latching the electronic module in the receiving recess. The electronic module is inserted into the socket through a top opening of the receiving recess. The electronic module is inserted into the receiving recess to resiliently depress the contact terminals so that the latch is allowed to move over the module and engage an outer edge of the module. The latch holds the module against the resiliently depressed contact terminals.

BRIEF DESCRIPTION OF THE DRAWINGS

The foregoing aspects and other features of the present invention are explained in the following description, taken in connection with the accompanying drawings, wherein:

FIG. 5 is a partial cross-sectional view of an electronic module test assembly in accordance with a second preferred embodiment of the present invention; and FIG. 6 is a magnified partial cross-sectional view of the electronic module test assembly in FIG. 5 showing features of a latch assembly in the test assembly.

DETAILED DESCRIPTION OF THE PREFERRED EMBODIMENT

Figure 1:
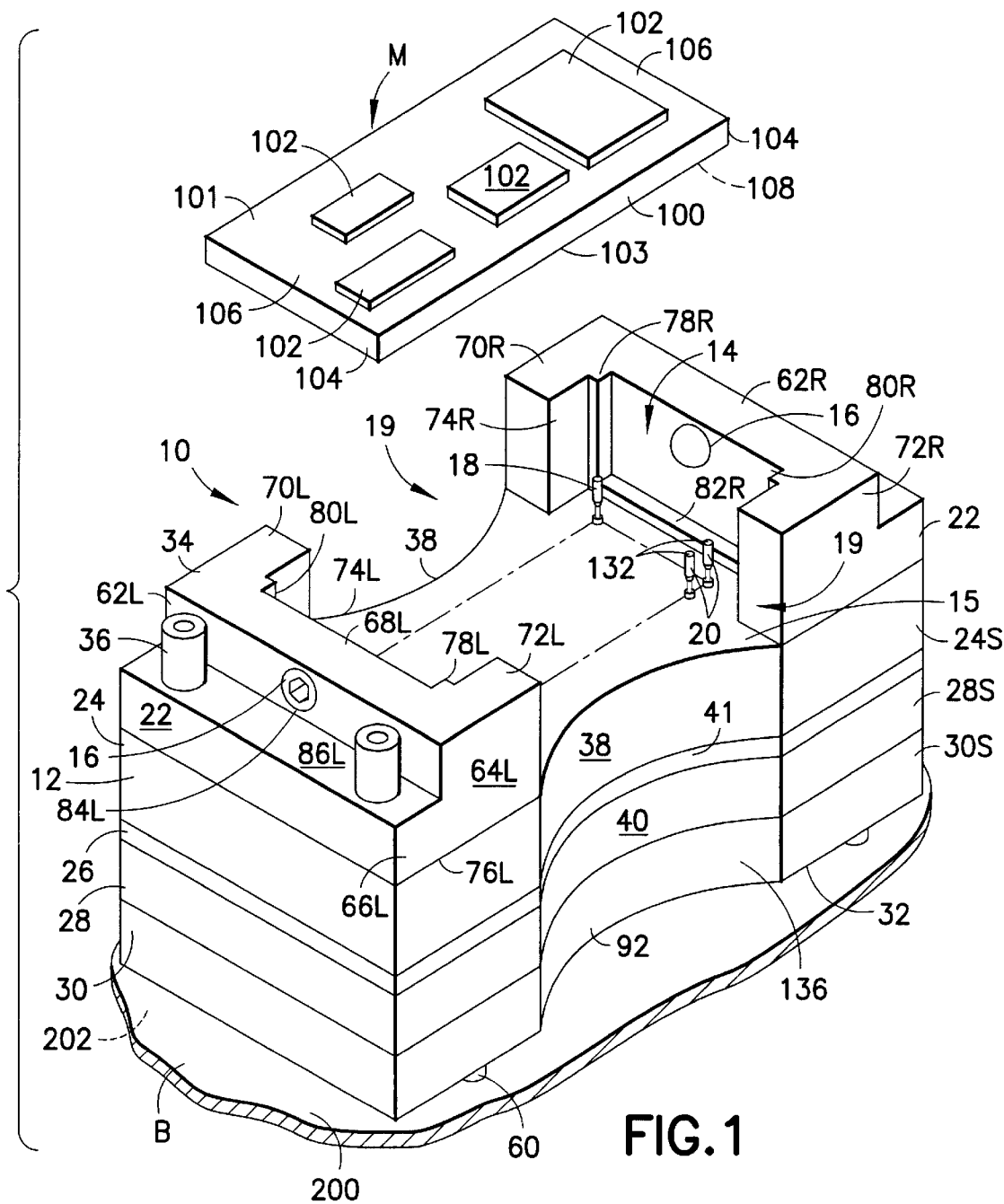
FIG. 1 is a perspective view of an electronic module test assembly, incorporating features of the present invention in accordance with a first preferred embodiment, an electronic module and a printed circuit board.

Referring to FIG. 1, there is shown an perspective view of a test assembly 10 incorporating features of the present invention in accordance with a first preferred embodiment of the present invention, an electronic module M and a printed circuit board B. Although the present invention will be described with reference to the single embodiment shown in the drawings, it should be understood that the present invention can be embodied in many alternate forms of embodiments. In addition, any suitable size, shape or type of elements or materials could be used.

In general, test assembly 10 comprises a socket frame 12, latches 16 and an array 18 of spring loaded contact pins 20. The socket frame 12 has a module receiving recess 14. Latches 16 are mounted to the frame 12 to latch a module in the recess. The array of spring loaded contact pins 20 projects into the recess 14. Test assembly 10 is mounted on test board B with terminal ends of the contact pins 20 connected to contact pads on the test board. Test assembly 10 interfaces the module M with test board B. The module M is inserted into the receiving recess 14 of the socket frame 12 until latches 16 engage the module. Contact pins 20 in the recess make contact with contacts on the module thereby effecting a connection between the module and contacts on the PCB. The open architecture of the test assembly 10 allows a user substantially unimpaired access to the top of the module M located in the receiving recess 14 of the test assembly 10.

Figure 2:
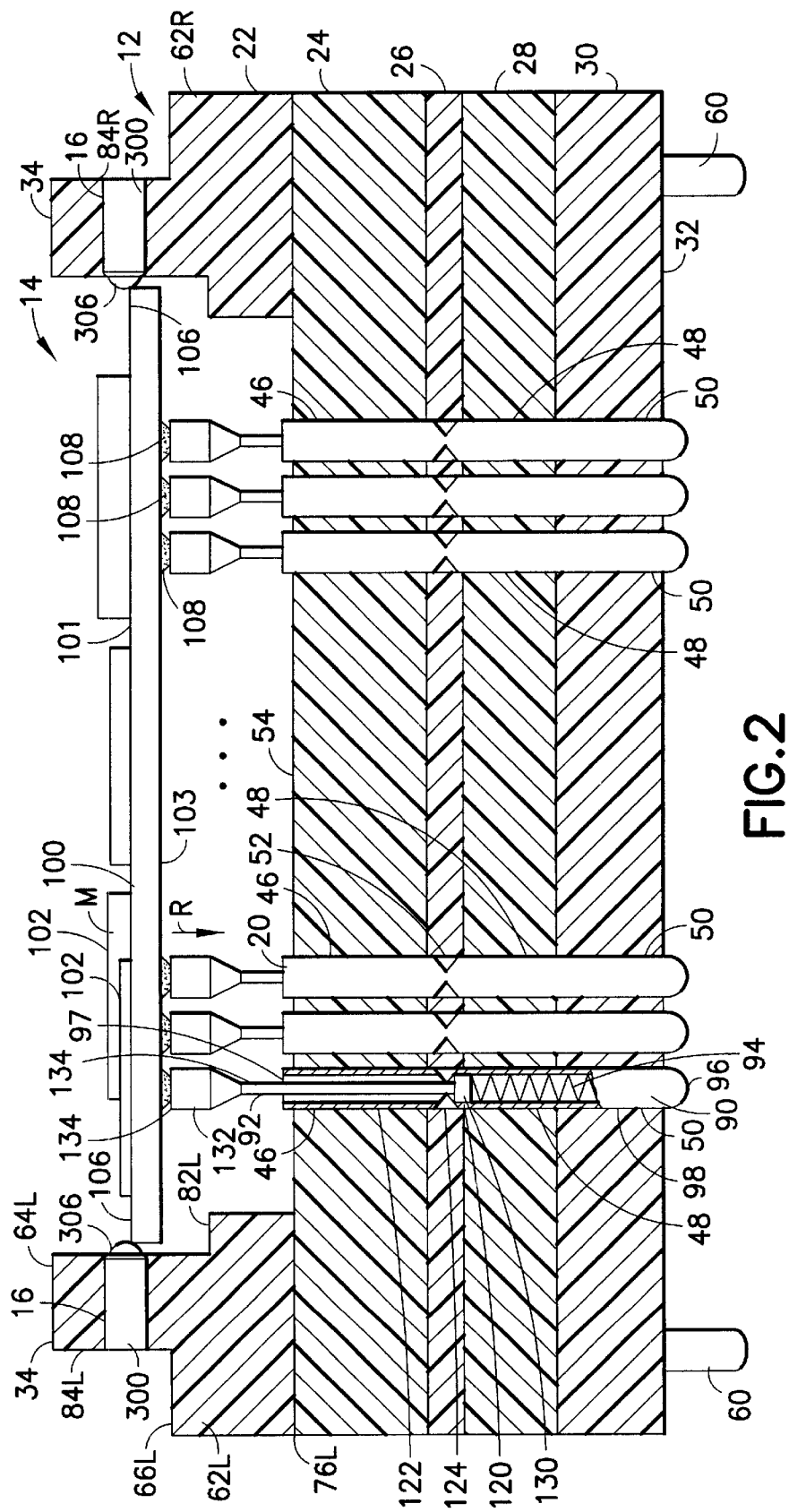
FIG. 2 is a cross-sectional view of the test assembly shown in FIG. 1 with the electronic module installed in the test assembly.

In greater detail, and referring still to FIG. 1, the electronic module M is a surface mounted electronic module, such as for example a "Bluetooth" architecture module. The present invention however is applicable equally to any other suitable surface mounted electronic module or package. The module M generally comprises a printed circuit board 100. The module M has a number of components 102 located on the top surface 101 of the circuit board. The components 102 may be integrally formed in the PCB 100 or may be otherwise mounted to the top of the PCB. The components 102 may be of any suitable type. In the case of a "Bluetooth" module, for example, the components may incorporate an entire RF base band radio subsystem onto the module. Referring also to FIG. 2, the module M also has an array of contacts 108 on the bottom surface 103 of the PCB 100. In the preferred embodiment the contact array on the PCB 100 is a ball grid array (BGA). In alternate embodiments, the contact array on the PCB of the electronic module may have any other suitable type of surface mounting contacts. Test board B is shown in FIG. 1 as a representative test board. The test board B thus generally comprises a PCB 200 with suitable integrated circuits (not shown) for performing desired testing on the module M. The PCB 200 also has an array 202 of contacts located on the upper surface of the board.

As noted before, the test assembly 10 has a socket frame 12, latches 16 and a contact array 18. Socket frame 12 is made of insulating material as will be described in greater detail below. In the preferred embodiment, shown in FIGS. 1 and 2, the socket frame 12 comprises layers 22–30, and fasteners 36. Two board layers 24, 28 are substantially similar to each other. Each board layer 24, 28 may be made from hard plastic or any other suitable insulating material. The boards 24, 28 are preferably cut from plastic sheets, though the boards may be formed in any other suitable manner. Accordingly, boards 24, 28 are substantially flat and as seen in FIG. 2, the boards 24, 28 are of similar thickness in this embodiment. In alternate embodiments the thickness of the boards may vary as desired. Each board 24, 28 is formed in a general rectangular shape. Each board 24, 28 also has a pair of scallops 38, 40 which are preferably cut into the opposite longitudinal sides 24S, 28S of the boards (see FIG. 1). The scallops 38, 40 are located in the sides of the boards 24, 28 so that when the boards are stacked the scallops 38, 40 are generally aligned with each other. Each board 24, 28 has an array of contact holes 46, 48. The contact holes 46, 48 extend through the respective board. Holes 46, 48 may be formed into the boards 24, 28 by drilling or any other suitable boring means. Each board 24, 28 also has four through holes (not shown) for fasteners 36.

As seen best in FIG. 2, in the preferred embodiment, the socket frame 12 has a thin intermediate layer 26. Layer 26 is cut or formed otherwise from high strength, elastic polyimide sheet such as Kapton® sheet available from DuPont®. The polyimide sheet from which frame layer 26 is cut may have a thickness of about 30 or 50 mils though in alternate embodiments the thickness of layer 26 may vary as desired. In other alternate embodiments, this layer of the frame may be made from any other suitable material. As can be realized from FIG. 1, layer 26 has a shape which conforms substantially to the shape of board layers 24, 28 described before. Thus, layer 26 also has a general rectangular shape, with scallops 41 formed in the longitudinal sides to line up with the scallops 38, 40 in board layers 24, 28. As shown in FIG. 2, layer 26 is also provided with an array of holes 52 for holding contacts 20. The holes may be punched or cut into layer 26. The holes 52 in layer 26, are located to line up with the contact holes 46, 48 in board layers 24, 28. Holes 52, however, are smaller than the matching holes 46, 48 in board layers 24, 28 as will be described further below. Layer 26 also has four fastener through holes (not shown) for fasteners 36.

Board layer 30 is the bottom layer of the socket frame 12. Except as otherwise noted below, board layer 30 is generally similar to layers 24, 28 described previously. Thus, like layers 24, 28, board layer 30 is also cut or formed from hard plastic to have a general rectangular shape with scallops 42 formed into longitudinal sides 30S. Contact holes 50 are drilled through the board layer to align with matching holes 46, 48 in layers 24, 26. Layer 30 also has four fastener holes (not shown) for fasteners 36. However, unlike layers 24, 28, in the preferred embodiment, the fastener holes in layer 30 are threaded to engage mating threads on fasteners 36. The fastener through holes in layers 24, 26, 28 are unthreaded. In addition, board layer 30 may be provided with receiving holes for mounting guide pins 60 into the board layer. The holes in layer 30 for guide pins 60 are blind holes made in the lower surface 32 of the board. In the preferred embodiment, board layer 30 has four guide holes for four guide pins 60, though in alternate embodiments the board may have any suitable number of holes therein for mounting guide pins. For example, the board may have several alternate patterns of guide holes to allow installation of the guide pins in one of the several patterns to suit a given configuration of holes in the test board. The bottom surface 32 of board layer 30 may also have standoff legs or chocks (not shown)located in any suitable pattern to support the test socket 10 off the test board B. The standoff legs may be formed integral with the board layer 30 or may otherwise attach to the bottom surface by any suitable means such as adhesive.

Figure 4:
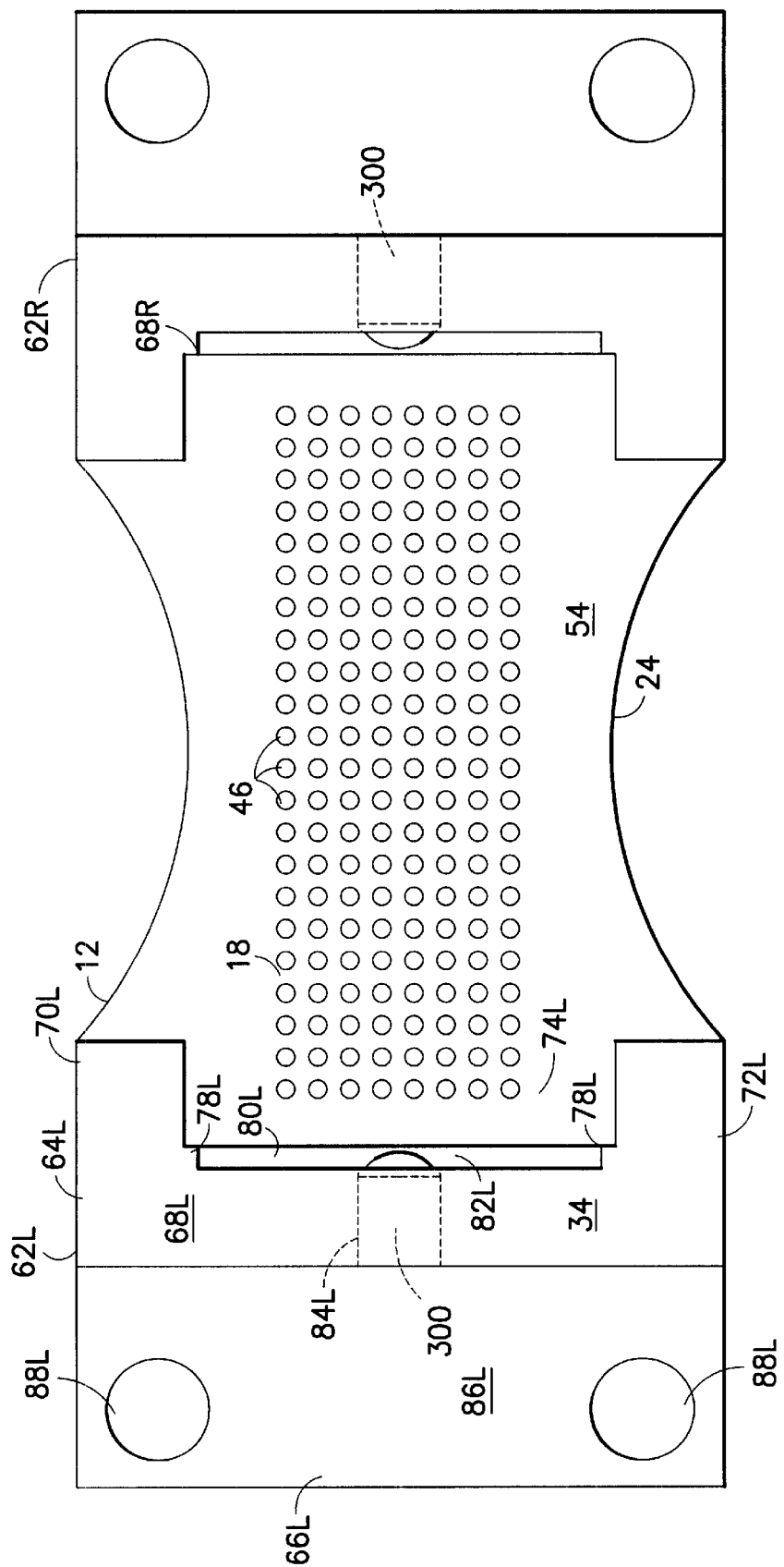
FIG. 4 is a top plan view of the test assembly shown in FIG. 1.

Referring now also to FIG. 4, which shows a plan view of the top of the socket frame 12, the upper layer 22 of the socket frame preferably comprises two independent end blocks 62R, 62L. End block 62R is similar, but opposite hand to end block 62L and similar features are similarly numbered. The end blocks 62R, 62L will be described below with specific reference to block 62L unless otherwise noted. End block 62L generally comprises a raised inner section 64L with an outer mounting flange 66L depending therefrom. The block 62L is a one piece member which may be molded or otherwise formed from plastic. As seen in FIGS. 1 and 4, the inner section has a general channel configuration with a center wall 68L extending laterally across the block and two side wall 70L, 72L projecting inwards from the center wall 68L (see FIG. 4). The lateral wall 68L and two side walls 70L, 72L define a channel 74L which extends from the top 34 to the bottom surface 76L of the block 62L (see FIG. 1). As shown in FIG. 4, the channel 74L has a pair of inner locating steps 78L formed in the inside corners of the channel (FIG. 1 shows the inner step 68R for the channel 74R in block 62R which is representative of the inner steps 68R, 68L in both blocks 62R, 62L). The inner steps 78L are sized so that the locating or guide chamber 80L in between the steps conforms closely to the shape of the ends 104 of the electronic module M. In the preferred embodiment, a stop or snubber flange 82L is located in the locating channel 80L (the stop 82R located in the locating channel 80R of block 62R is shown in FIG. 1). The center wall 68L has a bore 84L formed therethrough which opens into the locating channel 80L. As shown in FIGS. 2, mounting flange 66L is stepped from the top 34 of the block 62L. The upper surface 86C of the mounting flange is substantially flat. The mounting flange has a pair of fastener holes 88L for fasteners 36.

Figure 3:
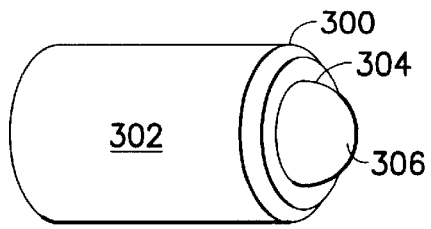
FIG. 3 is a perspective view of a spring loaded ball plunger of the test assembly shown in FIG. 1.

Referring now to FIGS. 2 and 3, in the preferred embodiment, each block section 62R, 62L has a spring loaded ball plunger 300. A perspective view of the ball plunger is shown in FIG. 3. The ball plunger 300 shown in FIG. 3 is an example of a suitable ball plunger which may be used with this preferred embodiment of the present invention. As such, the ball plunger 300 comprises a cylindrical casing 302, a spring (not shown) and a ball 306. The ball 306 and spring are housed in the casing 302. The spring biases the ball 306 so that a portion of the base protrudes through an opening 304 at one end of the plunger. The outer surface of the casing may be threaded to allow the plunger to be mounted into a suitable threaded bore. The plunger may also be provided with features or facets (e.g. hexagonal socket for Allen wrenches) at one end to allow engagement to a suitable torque tool. As is shown in FIGS. 1 and 2, the ball plungers 300 are threaded into the bores 84L, 84R of the end blocks 62L, 62R. The ball plungers 300 are threaded into the blocks until the protruding portions of the spring loaded balls 306 project into the locating channels 80L, 80R of the end blocks 62L, 62R.

As noted before, the test assembly 10 includes an array 18 of contact pins 20. The details of the contact pins 20 are shown in FIG. 2. In the preferred embodiment, the contact pins 20 are spring loaded pins or pogo-pins. The contact pins 20 are substantially the same. Each pin 20 generally comprises a hollow cylindrical casing 90, a spring loaded terminal pin 92 and a spring 94. Casing 90 is made out of any suitable metal such as for example cartridge brass, or aluminum alloy. The casing 90 has a closed terminal end 96 and an open end 97. The casing 90 has a lower section 98, an intermediate mounting section 120 and an upper section 122. The length of the lower section 98 may be established as desired. For example, in FIG. 2, the contact pin 20 is configured for surface mounting the terminal end 96 to a contact on the test board B. Thus, the lower section 98 is such that the terminal end 96 of the pin is located with a small standoff from the lower surface 32 of the test socket frame 12. In alternate embodiments, the lower section of the pin may be lower to allow insertion of the pin into a hole of the test board. The mounting section 120 of contact pin 20 is located on top of the lower section. In the mounting section 120, the outer casing has an annular indentation 124 forming a wasp waist shape. The upper section 122 extends from the mounting section upwards. The upper section 15 is shown in FIG. 2 as having a length sufficient to extend through board layer 24, though in alternate embodiments the upper section may be provided with any length sufficient to stably hold the casing in the hole 46 of board layer 24. The outer casing 90 has a diameter which allows the casing to pass freely through contact holes 46, 48 50 in the board layers 24, 28, 30 of the socket frame.

The casing 90 however, results in an interference with holes 52 in the Kapton® layer 26 of the frame as will be explained further below. The spring loaded terminal pin 92 has a lower contact bushing 130, an upper contact end 132, and a connecting rod 134 extending therebetween. The bushing 130 is sized to form a close sliding fit in the bore of the lower section 98. The bushing 130 however is prevented by the annular groove 124 from moving past the mounting section 120. Bushing 130 may be made from brass or any other suitable metal with good sliding properties. The outer surface of the bushing contacts the inner surface of the casing 90 to effect electrical contact therebetween. The upper contact end 132 of the spring terminal pin 92 is located outside the outer casing 90. The contact end 132 may include blades or any other suitable feature terminating in a sharp upper edge 134 or one or more piercing tips. Spring 94 may be a helically wound metal wire spring or any other suitable axial spring. Spring 94 is held in the lower section 98 of the pin casing 90. The spring rests against the bottom of the lower section 98 and the bushing 130 of the terminal pin 92 rests on the spring. Thus, inward axial movement of the pin (in the direction indicated by arrow R) causes the bushing 130 to compress the spring 94.

Testing assembly 10 may be assembled in any desirable manner. By way of example, test frame 12 is formed by stacking layers 22, 24, 26, 28, 30. Ball plungers 300 shown in FIG. 2 may be installed in the respective end blocks 62L, 62R before or after assembly of the test frame. Fitted guide pins (not shown) may be inserted in the contact holes to help align the contact holes in the board layers. Otherwise, the fasteners 36 may have shanks with diameters fitted to the fastener holes such that insertion of the fasteners through the holes in the boards 24, 26, 28, 30 results in alignment of the corresponding contact holes in the boards. After the layers 22, 24, 26, 28, 30 are stacked together, the fasteners 36 are threaded into the bottom layer 30 to secure the layers together and form the socket frame 12. As seen in FIG. 1, the channels 74L, 74R in the end blocks 62L, 62R define the module receiving recess 14 in the socket frame 12. The gaps between opposing side walls 72L, 72R, 70L, 70R define side openings 15 into the recess 14. The scallops 38, 41, 40, 42 in the longitudinal sides of layers 24, 26, 28, 30 are generally aligned to form finger recesses 136 on opposite sides of the socket frame. Guide pins (see FIG. 2) for guiding installation of the socket frame 12 on the test board B are preferably inserted into appropriate holes in the bottom 32 of the socket frame after the frame is assembled. Otherwise, the guide pin 60 may be installed into board layer 30 at any other suitable time. The contact pins 20 of the array 18 are also inserted into the socket frame 12 after assembly. The contact pins 20 may be held on a common carrier frame (not shown) and inserted into the contact holes through receiving recess bottom surface 54. As noted before, the outer casing 90 slides freely through the holes 46, 48, 50 in board layers 24, 28, 30 but has an interference fit in hole 52 of the Kapton® layer 26. Kapton® layer 26 is however sufficiently elastic so that under sufficient down force, the rounded end 96 of casing 90 will elastically expand hole 52 to allow the lower section 98 of the casing to pass through the hole. Insertion of the pin 20 into the socket is stopped when the mounting section 120 reaches the Kapton® layer 26. The elastically expanded hole 52 returns to its original size and enters into the annular groove 124 of the mounting section. This locks the contact pin 20 into the socket frame 12. As seen in FIG. 2, in this position the bottom ends 96 of the contact pins extend out of the bottom 32 of the frame. The resilient upper contact ends 132 of the contacts project from the bottom surface 54 into the receiving recess 14 of the socket frame. It can be realized from FIG. 2, that in alternate embodiments the Kapton® layer may be located in any desired location in the layer stack in conjunction with the mounting section on the contact pin casing being positioned to coincide with the Kapton® layer. In other alternate embodiments, the socket frame may be made from any desired number of layers, or may be a molded one-piece member. The complete testing assembly 10 may be mounted to the test board B by placing the guide pins 60 into receiving holes (not shown) in the PCB 200 (see FIG. 1). In the case of surface mounted arrangement such as shown in FIG. 2, the bottom contact ends 96 of pins 20 rest against contact pads on PCB 200 and are soldered to the contacts using wave flux soldering for example. In alternate embodiments, the pin contact ends may extend sufficiently for through mounting the pins to the test board PCB.

Referring still to FIGS. 1 and 2, the module M is inserted into the receiving recess 14 of testing assembly through the opening in the top 34 of the socket frame. As can be realized from FIG. 1, an operator may hold the module, for example, between thumb and forefinger while inserting the module M into recess 14. Openings 15 in the sides of the recess, and finger recess 136 allow the user to maintain a sure grip on the module M even when the module is fully inserted into the recess. Before the module M is placed into the recess, the upper contact ends 132 of the contact pins 20 are in an extended position. In this position, the tips 134 (see FIG. 2) of the contact ends 132 may be generally aligned with or higher than the spring loaded ball 306 of latches 16. When the module is inserted into the recess 14, the module M is moved past the spring loaded balls 306 (which are resiliently deflected aside to allow passage of the module M) to press against the resilient contact ends 132 of the contact pins. The contacts are depressed by the module until the upper surface 101, of PCB 100 is located below the spring loaded balls 306 which spring back to engage the edges 106 at the end 104 of the module PCB. This position is shown in FIG. 2. The contact ends 132 are resiliently depressed from their extended position and in response urge the module PCB upwards. The spring loaded latches 16 engages outer end edges 106 of the PCB 100 to restrain the module M in the recess. The ends 104 of the module are guidingly held in locating channels 80L, 80R during insertion of the module M, and help align the module M in the recess such that ball contacts 108 on the bottom of the module are aligned with corresponding contact ends 132 of the socket. The tips 134 of the contact ends 132 are sufficiently sharp to pierce the ball contacts of module M and thus effect electrical contact therebetween. As can be realized from FIGS. 1 and 2, the contact array conforms to the ball grid array on the module M. Also, when mounted in the recess 14 of the testing assembly 10, the upper surface 101 of the module M and the components 102 thereon are exposed and readily accessible to the operator through the opening in the top 34 of the frame as well as the side openings 15.

Referring now to FIG. 5, there is shown a partial cross-sectional view of a test assembly 310 in accordance with a second preferred embodiment of the present invention, and module M mounted in the test assembly. Except as otherwise noted below, test assembly 310 is substantially similar to test assembly 10 described previously and shown in FIGS. 1, 2 and 4. Similar features of the test assemblies in the two preferred embodiments are similarly numbered. The test assembly 310 in the second preferred embodiment also comprises a socket frame 312 with spring contact pins 320 mounted therein. The socket frame 312 has a top layer 322 mounted on a stack 324 of plastic board layers (similar to layers 24, 26, 28 30 of the frame 12 shown in FIG. 1). The top layer 322 has two end blocks 362L, 362R (similar to blocks 62L, 62R in FIG. 1) which define the module receiving recess 314 of the socket frame 310 (in a similar manner to that described before for frame 12). The spring contacts 320 are similar to the contacts 20 in test assembly 10 shown in FIG. 2. Spring contacts 320 are located in holes in the socket frame to form a contact array 318 matching the ball grid array on the module M. The contact ends 432 of the spring loaded pins 392 of the contact pins 320 project from the bottom 354 into the recess 314 of the socket. The contact ends 432 are disposed initially at an extended height, and upon insertion of the module M into the recess 314 are resiliently depressed to a depressed position as will be described in greater detail below.

Referring now also to FIG. 6, the test assembly 310 includes a latch 316 mounted to end block 362R. The opposite end block 362 is provided with an inwardly extending flange or tab 371 as shown in FIG. 5. The tab 371 on block 362L and latch 316 on block 362R cooperate as will be described further below to lock the module M in the recess 314. Tab 371 is cantilevered into recess 314 from the central wall 368L of the block. The tab 321 may be integrally molded on the block. The tab 371 is located above the stop 382L (which is similar but opposite to stop 82R in FIG. 1) and forms recess 373 for end edge 106 of the module M. The vertical height of tab 371 above the bottom 354 of recess 314 may be set so that the tab 371 is generally level with the tips of the contact ends 432 when the spring loaded pins 392 are in the extended position. The recess 14 also has access openings 19 on opposite sides of the recess to provide access to the electronic module in the recess 14.

FIG. 6 is a magnified partial cross-sectional view of block 362R showing features of latch 316. Latch 316 is movably mounted to the center wall 368R of the block 362R generally opposite tab 371 (in a relationship similar to that shown for opposing ball plungers 300 in FIG. 4). As seen in FIG. 6, latch 316 generally comprises a latch arm 402, mount spindle 408, and spring 412. Latch arms 402 may be a one piece member made of suitable metal or plastic. The arm 402 generally comprises a mid-section or hub 405, a catch member 404 and a lever section 406. Hub 405 has a bore therethrough for spindle 408. The catch member 404 preferably has an upper cam surface 407. Spindle 408 is a rod made from any suitable metal or plastic. Spring 412 is a torsion spring made from suitable spring wire which is helically wound. The spring 412 has two engagement ends 412A, 412B as shown in FIG. 6. The latch 316 is located within a recess or pocket 410 in wall 368R of block 362R. The arm 402 is placed into the pocket 410 with the catch 404 extending into recess 314 and the lever section 406 extending out above the upper surface 334 of the block. The spring 412 is placed in the pocket 410 and the spindle 408 is inserted through the spring and the bore in the arm 402 as seen in FIG. 6. One end 412B of the spring is interlocked with the lever section 406, and the other end is locked against the block 362R. In this position, the spring biases the latch in clockwise direction (indicated by arrow P) against the wall 368R of the block section. The latch 404 extends into the recess 314 substantially level with the tab 371 of block 362L (see also FIG. 5).

In this embodiment the module M may be inserted into the test assembly 10 by placing on end 104 of the module M in recess 373. The contact ends 432 of spring pins 392 bias portion 106 of the module against tab 371. The module M may then be pivoted in the direction indicated by arrow I in FIG. 5 into the recess 314. During rotation into the recess, the module comes into contact with the cam surface 407 of the catch 404 and cams the catch 404 down. This allows the module end 104 to move into the recess 314 to position $I_1$, shown in FIG. 6. When the module M is in position $I_1$, the cammed catch 404 (shown in phantom in FIG. 6) is released and springs back under bias from spring 412 to its initial position. During the insertion of the module M into recess 314, the module M resiliently depresses the contact ends 432 of spring pin 392. After the catch 404 on catch 316 returns to its initial position, the depressed spring pins 392 urge the module M upwards against the catch 404. The module M is now in position $I_2$ shown in FIG. 6. The catch 404 of latch 316 engages the edge 106 of the module M and holds module in the test assembly 310. As in the first preferred embodiment, the module M is held in the socket in such a way that access to the components on the module is substantially unobstructed.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electronic module test assembly comprising:
   a frame with a recess formed therein for receiving an electronic module;
   an array of contact pins positioned in the frame, the contact pins having resiliently depressible terminals forming a resiliently depressible contact array in the recess; and
   at least one latch movably mounted to the frame for latching the electronic module to the frame, the at least one latch being movable relative to the frame and engaging an edge of the electronic module when the electronic module is disposed against the resiliently depressible contact array, the resiliently depressible contact array biasing the electronic module against the at least one latch, wherein the latch comprises at least one spring loaded member having a curvilinear end which extends into the recess, wherein the curvilinear end is adapted to be horizontally depressed in a direction into a hole of the frame by insertion of the electronic module into the recess and subsequently resiliently moved in an opposite direction into the recess to engage the edge of the electronic module.

2. The test assembly according to claim 1, wherein the contact pins are spring loaded pins, each spring loaded pins comprising a first section mounted to the frame, a second section comprising one of the resiliently depressible terminals movably mounted to the first section, and a spring between the first section and second section axially biasing the second section into the recess.

3. The test assembly according to claim 1, wherein the resiliently depressible terminals of the contact pins project from a bottom surface of the recess into the recess, and the electronic module is inserted through a top opening of the recess into the recess.

4. The test assembly according to claim 3, wherein the at least one latch holds the electronic module pressed against the resiliently depressible contact array effecting electrical contact between the contact array and electronic module, and wherein the top opening of the recess remains open when the electronic module is in electrical contact with the contact array.

5. The test assembly according to claim 4, wherein the top opening of the recess remains substantially open providing user access to the electronic module when the electronic module is in electrical contact with the resiliently depressible contact array.

6. The test assembly according to claim 1, wherein the recess has guide slots at opposite ends of the recess for guiding insertion of the electronic module into the recess.

7. The test assembly according to claim 1, wherein the recess has access openings on opposite sides of the recess to provide access to the electronic module in the recess, and wherein the recess has grooves at opposite ends of the recess, the grooves conforming to ends of the electronic module.

8. The test assembly according to claim 1, wherein the resiliently depressible contact array is depressed inwards into the recess when the electronic module is inserted into the recess.

9. The test assembly according to claim 1, wherein when the electronic module rests against the resiliently depressible contact array, tips of the resiliently depressible terminals contact corresponding ball contacts of a ball grid array of the electronic module.

10. The test assembly according to claim 9, wherein the tips of the resiliently depressible terminals pierce into corresponding ball contacts of the ball grid array of the electronic module when the electronic module rests against the resiliently depressible contact array.

11. The test assembly according to claim 1, wherein the resiliently depressible terminals are axially displaced by the electronic module when the at least one latch engages the electronic module.

12. The test assembly according to claim 1, wherein one end of the recess has a tab cantilevered into the recess, the tab engaging another edge of the electronic module and biasing the electronic module against the resiliently depressible contact array when the module is inserted into the recess.

13. The test assembly according to claim 1, wherein the resiliently depressible contact array contacts one side of the electronic module, and the at least one latch engages the opposite side of the module.

14. The test assembly according to claim 1, wherein the frame comprises a number of board layers fixedly mounted together, the contact pins being secured to at least one board layer.

15. The test assembly according to claim 14, wherein the frame has two end blocks mounted to one of the board layers, the end blocks defining the recess inbetween.

16. The test assembly according to claim 14, wherein the number of board layers comprises at least one guide hole for installation of a guide pin.

17. The test assembly according to claim 1, wherein the frame has a finger notches on opposite sides of the recess.

18. The test assembly according to claim 1, wherein the contact pins are anchored to the frame, and wherein at least one of the contact pins is a spring loaded pin which has a section fixed to the frame.

19. An electronic module test assembly comprising:
a frame with a recess formed therein for receiving an electronic module;
an array of contact pins positioned in the frame, the contact pins having resiliently depressible terminals forming a resiliently depressible contact array in the recess; and
at least one latch movably mounted to the frame for latching the electronic module to the frame, the at least one latch being movable relative to the frame and engaging an edge of the electronic module when the electronic module is disposed against the resiliently depressible contact array, the resiliently depressible contact array biasing the electronic module against the at least one latch,
wherein the at least one latch comprises a pair of spring loaded balls mounted at opposite ends of the recess.

20. An electronic module test assembly comprising:
a frame with a recess formed therein for receiving an electronic module;
an array of contact pins positioned in the frame, the contact pins having resiliently depressible terminals forming a resiliently depressible contact array in the recess; and
at least one latch movably mounted to the frame for latching the electronic module to the frame, the at least one latch being movable relative to the frame and engaging an edge of the electronic module when the electronic module is disposed against the resiliently depressible contact array, the resiliently depressible contact array biasing the electronic module against the at least one latch,
wherein the at least one latch comprises a rocker arm pivotably mounted to the frame and a spring between the rocker arm and frame, the spring biasing the rocker arm to an engaged position, wherein the frame comprises a stationary extending flange located on the frame on an opposite side of the rocker arm and extending into the recess, and wherein the stationary extending flange is adapted to have an edge of the electronic module located under the flange while an opposite edge of the electronic module is latched under the rocker arm to latch the electronic module into the recess.

21. The test assembly according to claim 20, wherein the spring is a torsion spring made from spring wire which is helically wound.

22. An electronic module test socket comprising:
an insulating frame with an electronic module receiving recess formed therein;
at least one contact pin positioned in the frame with a resiliently movable contact terminal disposed in the recess; and
at least one latch connected to the frame, the at least one latch being movable relative to the frame for locking an electronic module received in the recess to the frame, wherein the at least one latch comprises a spring loaded plunger with a partially spherical shaped contact surface, and wherein the contact surface is adapted to be horizontally depressed in a direction outward from the recess as the electronic module is inserted into the recess and resiliently move in an opposite horizontal direction onto a top surface of the electronic module to latch the electronic module in the recess;
wherein when the electronic module is received in the recess, the electronic module resiliently moves the contact terminal effecting contact between the module and contact terminal and allowing the at least one latch to move and engage a top side of the module maintaining the module in contact with the contact terminal and leaving an access area over the module open for a user to access module components on the top side of the module.

23. The test socket according to claim 22, wherein the at least one contact pin comprises an array of contact pins, each contact pin of the array having a resiliently movable contact terminal.

24. The test socket according to claim 22, wherein when the electronic module is inserted into the receiving recess, the module resiliently moves the contact terminal in an inward direction into the receiving recess.

25. The test socket according to claim 22, wherein the at least one contact pin has a mounting section for mounting the at least one contact pin to the frame and a spring loaded terminal section axially biased relative to the mounting section.

26. The test socket according to claim 22, wherein when the at least one latch is engaged to the electronic module, spring biases from the contact terminal on the nodule results in the module holding the at least one latch in a locked position.

27. An electronic module test socket comprising:
an insulating frame with an electronic module receiving recess formed therein;
at least one contact pin positioned in the frame with a resiliently movable contact terminal disposed in the recess; and
at least one latch connected to the frame, the at least one latch being movable relative to the frame for locking an electronic module received in the recess to the frame;
wherein the at least one latch is spring loaded, and wherein when the electronic module is inserted into the receiving recess the at least one latch is resiliently deflected by the module so that the module is received in the recess, and when the module resiliently moves the contact terminal a predetermined amount the at least one latch springs back to engage the module,
wherein when the electronic module is received in the recess, the electronic module resiliently moves the contact terminal effecting contact between the module and contact terminal and allowing the at least one latch to move and engage a top side of the module maintaining the module in contact with the contact terminal and leaving an access area over the module open for a user to access module component on the top side of the module.

28. A method for testing an electronic module, the method comprising the steps of:
providing a test socket with an electronic module receiving recess therein and an array of spring loaded contact pins having resiliently depressible contact terminals projecting into the recess;
providing the test socket with a movable latch attached to a frame of the test socket for latching an electronic module in the receiving recess;
inserting the electronic module through a top opening of the receiving recess into the receiving recess to resiliently depress the contact terminals; and
moving the latch on the frame as the electronic module is inserted so that the latch is allowed to move over the module and engage an edge of the module, the latch holding the module against the resiliently depressed contact terminals, wherein the latch comprises a spring loaded plunger which is horizontally moved in an outward direction from the recess by the electronic module as the electronic module is inserted into the recess and which is resiliently biased in an opposite direction onto a top side of the electronic module.

29. The method according to claim 28, wherein insertion of the electronic module into the receiving recess causes tips of the contact terminals to contact corresponding ball contacts of the electronic module thereby effecting contact therebetween.

30. The method according to claim 29, wherein the tips of the contact terminals penetrate corresponding ball contacts of the electronic module during insertion of the electronic module into the receiving recess.

31. The method according to claim 28, further comprising the step of accessing components on a top surface of the electronic module through the top opening of the receiving recess, wherein the latch engages the edge of the electronic module such that user access through the top opening of the recess is unimpaired.

32. An electronic module test assembly comprising:
a frame adapted to receive an electronic module;
an array of contact pins positioned in the frame, the contact pins having resiliently depressible terminals forming a resiliently depressible contact array; and
at least one latch movably mounted to the frame for latching the electronic module to the frame, the at least one latch being movable relative to the frame and engaging an edge of the electronic module when the electronic module is disposed against the resiliently depressible contact array, the resiliently depressible contact array biasing the electronic module against the at least one latch, wherein the latch comprises a spring loaded rocker arm, wherein the frame comprises a cantilevered stationary flange extending into the recess from a side of the recess opposite the rocker arm, and wherein the flange is adapted to have a side of the electronic module located under the flange with an opposite side of the electronic module latched under a portion of the rocker arm to thereby latch the electronic module into the recess.

* * * * *